US010698066B2

(12) United States Patent
Polley et al.

(10) Patent No.: US 10,698,066 B2
(45) Date of Patent: Jun. 30, 2020

(54) CALIBRATION OF HALL DEVICE SENSITIVITY USING AN AUXILIARY HALL DEVICE

(71) Applicant: Texas Instruments Incorporated, Dallas, TX (US)

(72) Inventors: Arup Polley, Richardson, TX (US); Srinath Ramaswamy, Murphy, TX (US); Baher S. Haroun, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 252 days.

(21) Appl. No.: 15/952,521

(22) Filed: Apr. 13, 2018

(65) Prior Publication Data

US 2019/0317175 A1    Oct. 17, 2019

(51) Int. Cl.
*G01R 35/00* (2006.01)
*G01R 33/07* (2006.01)

(52) U.S. Cl.
CPC .......... *G01R 35/005* (2013.01); *G01R 33/07* (2013.01)

(58) Field of Classification Search
CPC ..... G01R 33/07; G01R 35/00; G01R 33/0041
USPC .......... 324/112–117, 202, 207, 251, 207.12, 324/202.2
See application file for complete search history.

(56) References Cited

U.S. PATENT DOCUMENTS

| 6,768,301 | B1 | 7/2004 | Hohe et al. | |
|---|---|---|---|---|
| 9,013,167 | B2 * | 4/2015 | Antonacci | G01R 33/072 |
| | | | | 323/294 |
| 9,810,759 | B2 | 11/2017 | Polley | |
| 10,197,638 | B2 | 2/2019 | Polley et al. | |
| 2009/0189694 | A1 * | 7/2009 | Davierwalla | H03F 3/45183 |
| | | | | 330/253 |
| 2011/0031960 | A1 | 2/2011 | Hohe et al. | |
| 2016/0209480 | A1 | 7/2016 | Hioka et al. | |

FOREIGN PATENT DOCUMENTS

| EP | 1364464 A2 * | 11/2003 | .......... H03G 3/3042 |
|---|---|---|---|
| EP | 2682762 A1 | 1/2014 | |

OTHER PUBLICATIONS

"Sensor Signal Conditioning IC for Closed-Loop Magnetic Current Sensors", DRV411, Texas Instruments, Inc., SBOS693B, Aug. 2013, Revised Dec. 2013, pp. 1-34.

(Continued)

*Primary Examiner* — Farhana A Hoque
*Assistant Examiner* — Courtney G McDonnough
(74) *Attorney, Agent, or Firm* — Michael A. Davis, Jr.; Charles A. Brill; Frank D. Cimino (57) ABSTRACT

In described examples, a Hall effect sensor includes a primary Hall effect sensor element and an auxiliary Hall effect sensor element. A known magnetic field is applied to the auxiliary Hall effect sensor to produce an auxiliary Hall voltage used in a feedback loop to control the bias current of the auxiliary Hall effect sensor to maintain the auxiliary Hall voltage approximately constant over a range of temperature and other factors. A bias current for the primary Hall effect sensor is controlled to track the bias current of the auxiliary Hall effect sensor to maintain the sensitivity of the primary Hall effect sensor approximately constant over the same range of temperature and other factors.

13 Claims, 11 Drawing Sheets

(56) References Cited

OTHER PUBLICATIONS

Arup Polley et al,"Transimpedance Amplifier-Based Reduction of Hall Sensor Parasitic Impedance", U.S. Appl. No. 15/186,394, filed Jun. 17, 2016, pp. 1-65.
International Search Report for PCT/US2019/026805 dated Jul. 11, 2019.

* cited by examiner

FIG. 14

CALIBRATION OF HALL DEVICE SENSITIVITY USING AN AUXILIARY HALL DEVICE

TECHNICAL FIELD

This relates to Hall Effect devices, and more particularly to calibration of Hall effect devices.

BACKGROUND

Hall effect sensors are the industry choice for medium sensitivity magnetic sensors due to low cost, small area, and easy integrability. However, all semiconductor Hall effect sensors suffer from offset resulting from fabrication process nonidealities such as mismatch, doping variations, and undesired piezoelectric effects. A technique referred to as "spinning current" partially reduces the offset at the expense of severe bandwidth degradation. Even the residual offset is large enough to limit accuracy in many applications. Moreover, the residual offset drifts depending on factors such as temperature, packaging, stress, variation, and aging.

The so called "Hall Effect" occurs when a magnetic field is oriented perpendicular to an electric current. Typical Hall sensors usually include a strip or plate of an electrically conductive material with an electric current flowing through the plate. When the plate is positioned in a magnetic field such that a component of the field is perpendicular to the plate, a Hall voltage is generated within the plate in a direction that is perpendicular to both the direction of the magnetic field and the direction of the current flow.

Semiconductor Hall effect sensors typically include a sensing element produced from silicon. The magnetic sensitivity of these devices is directly related to, and limited by, the electron mobility, mu, of the material used to construct the sensing element. Silicon typically has an electron mobility of approximately 1500 cm 2/(Vs).

SUMMARY

In described examples, a Hall effect sensor includes a primary Hall effect sensor element and an auxiliary Hall effect sensor element. A known magnetic field is applied to the auxiliary Hall effect sensor to produce an auxiliary Hall voltage used in a feedback loop to control the bias current of the auxiliary Hall effect sensor to maintain the auxiliary Hall voltage approximately constant over a range of temperature and other factors. A bias current for the primary Hall effect sensor is controlled to track the bias current of the auxiliary Hall effect sensor to maintain the sensitivity of the primary Hall effect sensor approximately constant over the same range of temperature and other factors.

DETAILED DESCRIPTION OF EXAMPLE EMBODIMENTS

In the drawings, like elements are denoted by like reference numerals for consistency.

Open and closed loop calibration methods are applied in a variety of contexts. One such context is in the calibration of Hall-effect magnetic field sensors. Hall-effect magnetic field sensors are solid state magnetic sensor devices that can be used to measure magnetic fields. Applications of Hall effect magnetic field sensors require high accuracy; however, they suffer from variation and drift in sensitivity with process variations, temperature, and package stress changes. The conventional solution to control for the complex temperature dependence that Hall-effect sensors exhibit is to implement so-called "open-loop" temperature compensation circuitry configurations. Fine-tuning (or "trimming") the sensitivity of each part for the process variation may be performed, and the changes in sensitivity with temperature and stress may be compensated for by using on-chip temperature and stress sensors and pre-evaluated compensation tables. This approach requires expensive multi-point characterization of individual devices and re-calibration over time. The magnetic field excitation for calibration of the sensor can be created using an on-chip current coil or external magnetic field sources. However, calibration can only be performed when the device is offline (not in operation), because the signal to be measured can interfere with the calibration signal.

As an alternative to the open-loop technique, closed-loop methods have been implemented to perform continuous calibration in the absence of external magnetic fields. Closed-loop calibration usually works as follows: a known magnetic field is applied to the device (such as passing a known temperature-insensitive current through an on-chip/off-chip coil/other suitable trace near the sensor), the sensor output is then compared with the desired response, and the sensor sensitivity/gain is adjusted to minimize the comparator error. This results in much higher accuracy than the open-loop configuration.

An issue with conventional closed-loop calibration of a Hall-effect sensor is that the calibration current near the Hall-effect sensor can generate enough heat that it changes the operating temperature, resulting in a change of sensitivity and affecting the primary measurement. Also, closed-loop calibrations have been demonstrated to perform well in the absence of external magnetic fields, but completely eliminating interference in real-world applications is non-trivial and can require offline calibration in a magnetically shielded environment.

An improved closed-loop calibration technique is described in U.S. Pat. No. 9,810,759, Amp Polley et al., entitled "Closed-Loop Device Calibration Using a Wide-band Signal," filed Jan. 14, 2016, which is incorporated by reference herein. However, the technique described therein may require allocation of limited Hall sensor system bandwidth for a calibration excitation signal. An in-band excitation signal may capacitively couple to the output. If a correlation of the calibration excitation signal and the external magnetic field that is being measured occurs, then a calibration error may occur. Coil heating effects may prohibit the use of complex loop designs such as two separate loops over the Hall effect sensor to create opposite fields.

Embodiments of the calibration technique described herein may avoid various issues encountered by prior closed loop calibration techniques. A separate matched Hall effect sensor may be used to calibrate the gain of a primary Hall effect sensor. In this manner, an alternating current (AC) calibration/excitation signal may have a higher frequency that is out of the signal-band of the primary Hall effect sensor. A high frequency magnetic field along with complex frequency hopping techniques may be easily applied because the auxiliary Hall effect sensor has more available bandwidth than the primary Hall effect sensor device(s). In this technique, a single large coil located a reasonable distance away from the Hall effect sensor elements may be used and thus can significantly reduce heating effects. The separate auxiliary channel provides for decoupling of the in-band signal and the high frequency calibration signal to provide a closed loop calibration capability.

Another example Hall effect sensor described herein may include a closed loop offset cancellation capability in addition to closed loop calibration capability.

Figure 1:
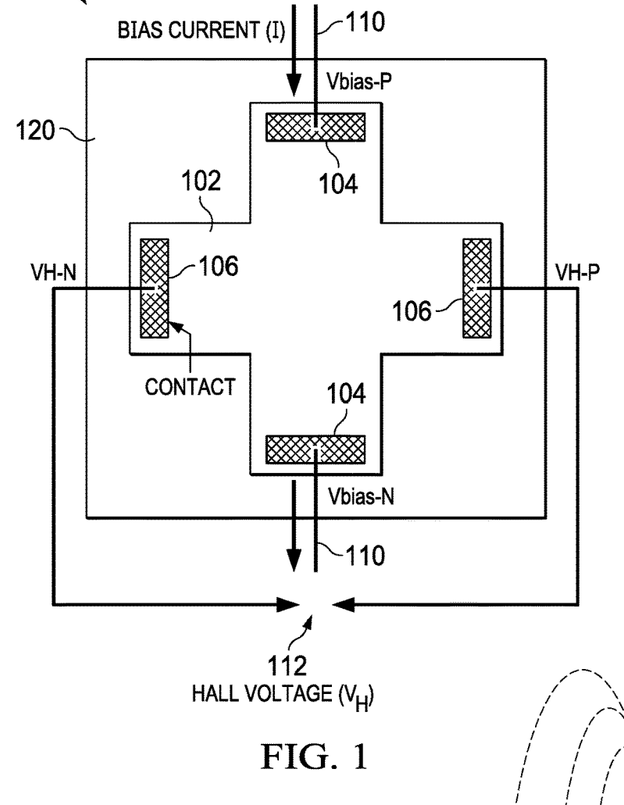
FIG. 1 is an illustration of an example Hall effect sensor.
Figure 2:
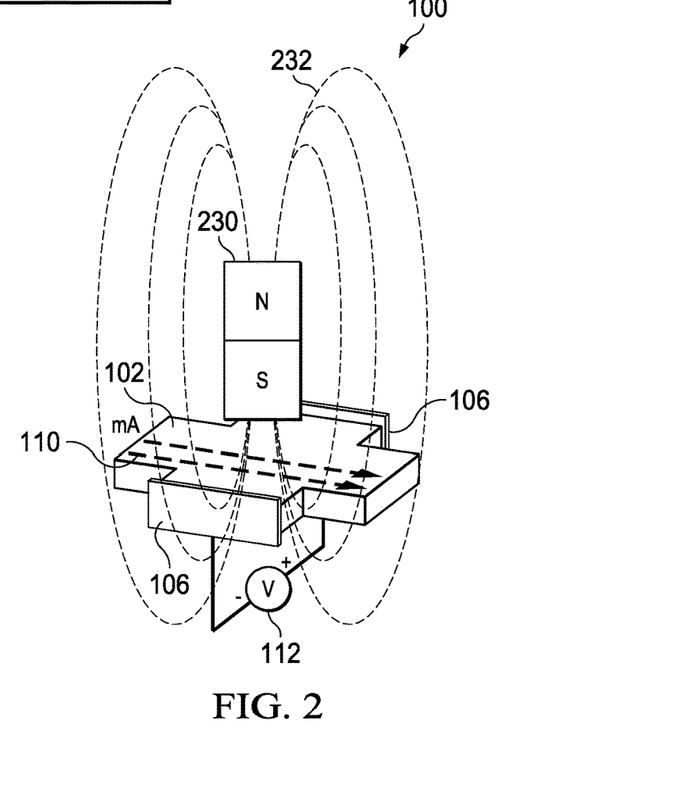
FIG. 2 illustrates the operation of the example Hall effect sensor of FIG. 1.

FIG. 1 is an illustration of an example horizontal Hall effect sensor device 100. FIG. 2 is an isometric view of Hall effect sensor 100. The general concept of a Hall effect sensor is not described in detail herein. As described hereinabove, the "Hall effect" occurs when a magnetic field is oriented perpendicular to an electric current. The magnetic field generates a voltage difference across a conductor, called the Hall voltage, in a direction that is perpendicular to both the direction of the magnetic field and the direction of the current flow. By measuring the Hall voltage, it is possible to determine the magnitude of the magnetic field.

In this example, Hall effect sensor element 102 may be fabricated on a substrate 120 using known or later developed semiconductor fabrication techniques. The key factor determining sensitivity of Hall effect sensors is high electron mobility. The following materials are especially suitable for Hall Effect sensors: gallium arsenide (GaAs), indium arsenide, (InAs) indium phosphide (InP), indium antimonide (InSb), graphene, etc.

Contact regions 104, 106 are formed in contact with element layer 102 in order to provide a bias current 110 through the Hall effect sensor element layer and to sense a resulting Hall voltage 112.

Hall effect element 102 may be patterned into a traditional cross shape, as illustrated in FIG. 1. In other embodiments, other element shapes may be patterned, such as an octagon or substantially octagonal shape, a triangle or substantially triangular shape, a quatrefoil or substantially quatrefoil shape, a circle or substantially circular shape, etc. Similarly, depending on the geometry of element layer 102, the number of contact pads 104, 106 and corresponding wires may be altered to fit a given application.

In this example, Hall voltage 112 may be represented by expression (1).

$$V_{Hall} = \frac{I_{bias} B_Z}{nte} \quad (1)$$

where:
$I_{bias}$=the current across the shape
Bz=the magnetic field normal to the shape
n=is the charge carrier density
t=thickness of the Hall element
e=the elementary charge This design results in a sensitivity of approximately 300 V/AT (volts/amp*Tesla). For example, a Hall voltage of approximately 30 uV will be produced with a bias current of 100 uA in a 1 mT field. The channel resistance may be approximately 5.7 k ohms.

FIG. 2 illustrates a magnet 230 positioned above Hall effect element 102 in an example sensing configuration. The magnet provides a target magnetic field for Hall effect element 106 to sense. Flux lines 232 from magnet 230 that penetrate Hall element 102 in a perpendicular or somewhat perpendicular manner with respect to the flow of bias current 110 produce a Hall effect voltage 112 that is formed across contacts 106.

Figure 3:
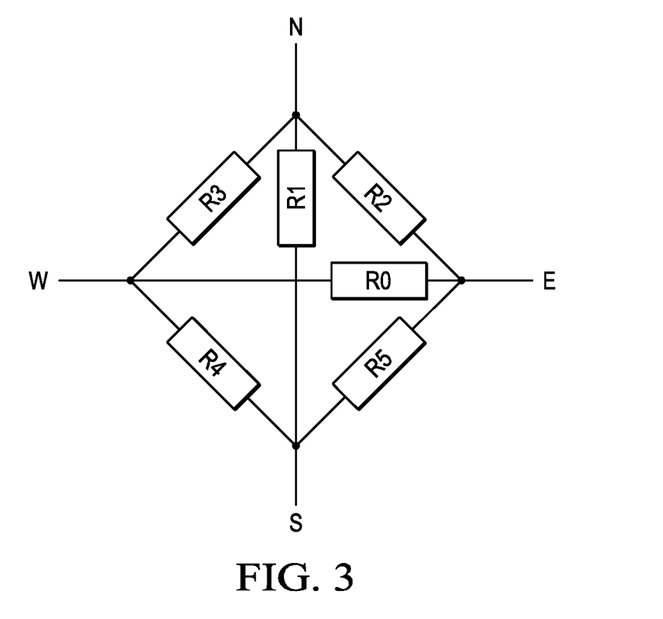
FIG. 3 is an equivalent electrical model of a Hall effect sensor.

FIG. 3 is a schematic illustrating an electrical equivalent of a Hall effect sensor device, such as horizontal Hall effect sensor 100. In this model, assume the bias current is injected at port N and removed at port S, and the Hall voltage is measured across ports W and E. There is an effective channel resistance R1 to the bias current and a channel resistance R0 in the Hall voltage path. Also, a Wheatstone bridge resistance effect is represented by resistors R2-R5. Usually, a large offset exists, due to resistor mismatch in the Wheatstone bridge type electrical model that is unavoidable, even with the state-of-the-art lithography and fabrication processes. Each and all of these resistance effects may vary over time and temperature to contribute to the offset voltage drift.

A bias current compensation technique referred to as "spinning current" may be used to at least partially reduce the offset. In this technique, the bias current is provided sequentially to at least two different pairs of contacts N, S, E, W on the Hall element. Superposition of the supplied currents results in a continuously spinning current vector in the Hall effect sensor device. By simultaneously measuring the voltages between corresponding terminals, a signal containing the Hall voltage and a periodic offset voltage can be isolated. The offset voltage may be eliminated by averaging the signal over at least one period.

Figure 4:
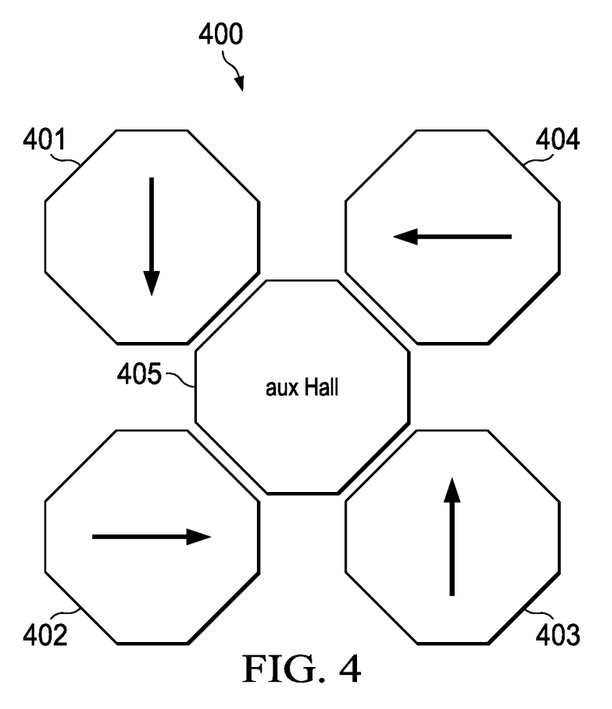
FIG. 4 illustrates an example arrangement of a set of primary Hall effect sensors with an auxiliary Hall effect sensor.

FIG. 4 illustrates an example arrangement of an array 400 of four primary Hall effect sensors 401-404 with an auxiliary calibration Hall effect sensor 405. In this example, the four primary Hall effect sensors 401-404 may be referred to as a "quad Hall effect sensor." Hall effect sensor array 400 includes a single central Hall effect sensor element 405, which defines a centroid about which the orthogonally coupled quad Hall effect sensor elements are arranged. The single Hall effect sensor 405 and each of the orthogonally coupled quad Hall effect sensors are usually of similar form (e.g., an octagon), composition, and function with respect to their own symmetry and with respect to the symmetry of other elements of the Hall effect sensor array 400. The elements are each placed in a symmetrical arrangement such that, for example, the effects of a magnetic field upon each element of the Hall effect sensor array 400 is substantially similar to the respective effects upon each of the other elements of the Hall effect sensor array. The orientation of the switched bias current flow of the orthogonally coupled quad Hall effect sensors is illustrated for a single switching phase, such as φ=0.

In operation, the single Hall effect sensor 405 generates a high bandwidth Hall-effect voltage in response to a magnetic field. For example, the single Hall element 405 generates a high bandwidth Hall-effect voltage in response to a magnetic field because the single Hall element 405 is not biased using a spinning current technique. In contrast, the adjacent peripherally arranged orthogonally coupled quad Hall effect sensors are biased using a spinning current technique wherein the bias currents of the orthogonally coupled quad Hall effect sensor elements are switched in each of four directions, such as northward, eastward, southward, and westward. The bias currents of the orthogonally coupled quad Hall effect sensors are switched such that the directions of the bias currents have an equal number of current flows in each of the directions regardless of the of the changes in direction of the bias currents in response to the changing of the switching phase. This example has one current flow in each direction on each switching phase.

Figure 5:
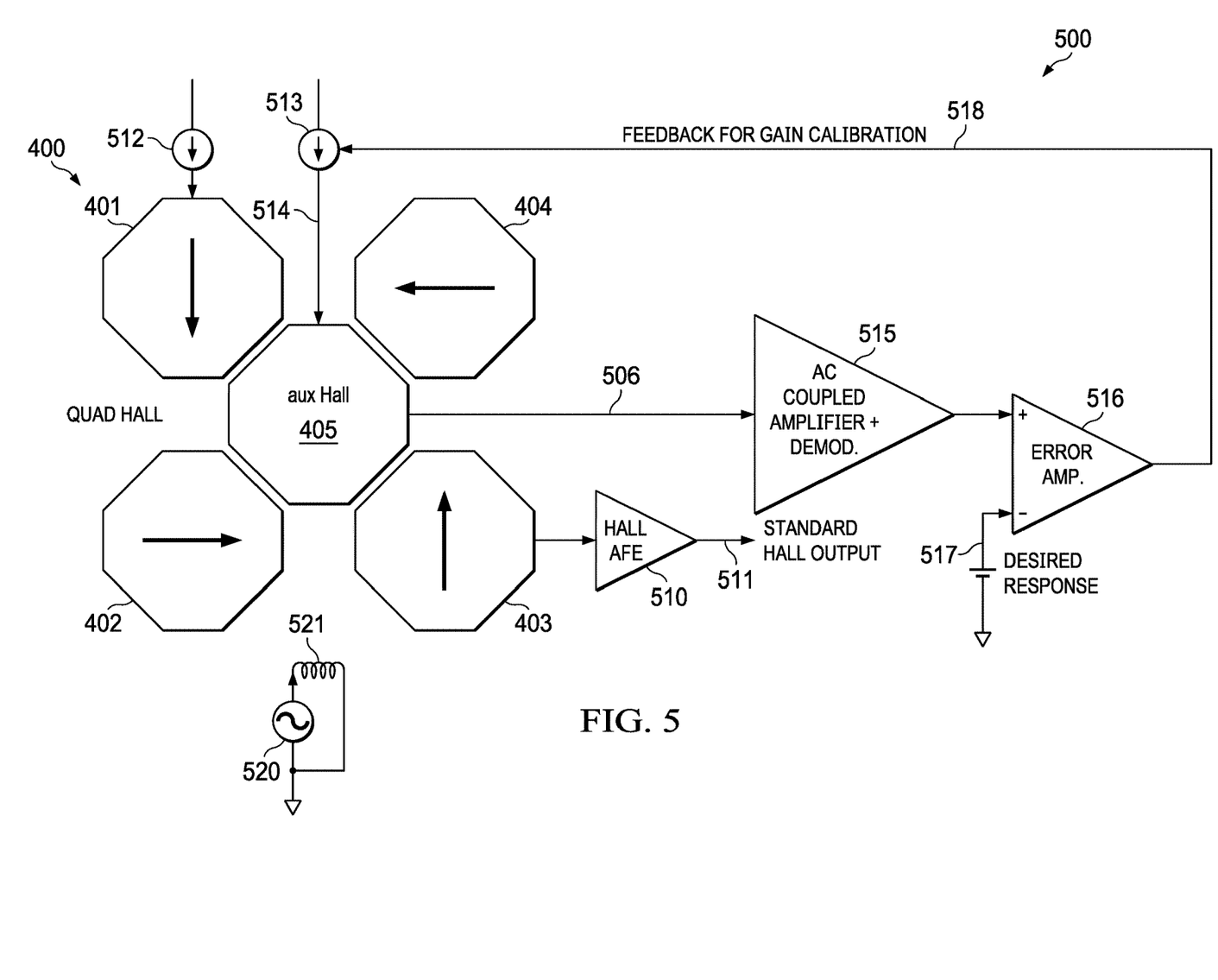
FIG. 5 is a block diagram illustrating calibration circuitry for the example set of Hall effect sensors of FIG. 4.

FIG. 5 is a block diagram of a Hall effect sensor device 500 illustrating calibration circuitry for the example quad Hall effect sensors 400 of FIG. 4. Hall effect sensor device 500 may be fabricated on a substrate, such as silicon, using known or later developed semiconductor fabrication techniques to form transistors and other components of the analog and digital circuitry illustrated herein. Multiple devices may be formed on the substrate, which may then be cut apart to form individual die. The die may be encapsulated or otherwise packaged using known or later developed packaging techniques to form components that may then be used in larger systems.

In this example, bias current generator 512 provides a bias current through a switching circuit to form the spinning current technique (SCT) arrangement described hereinabove in quad Hall effect sensor array 401-404. The Hall voltages generated by the quad Hall effect sensor array 401-404 is received by analog front end (AFE) amplifier 510 and produces an output signal 511 that is representative of a target magnetic field that is impinging on quad Hall effect sensor array 401-404. AFE amplifier 510 may include multiple inputs that are coupled to the output of each of the quad Hall effect sensors 401-404. AFE amplifier 510 may include a low pass filter to remove high frequency interference from the output signal 511. For example, the low pass filter may be designed to filter out frequencies above a certain frequency, such as within a range of 10 kHz to 500 kHz.

AFE amplifier 510 may be fabricated using known or later developed analog circuit techniques. In some examples, an analog to digital converter may be included to produce a digital output.

The SCT produces a standard Hall output 511 that has an acceptably low offset voltage at a nominal operating temperature, processing variation, and package stress level. As described hereinabove, a closed loop calibration loop may be used to maintain measurement sensitivity across a wide range of operating temperature, process variation, and package stress. In this example, an excitation structure, such as a coil 521, is fabricated on the substrate that includes quad Hall effect sensor 400. Excitation coil 521 may be configured to surround quad Hall effect sensor array 400, but be positioned far enough away so as not to cause heating of the quad Hall effect sensor array 400 due to current flowing through coil 521. Current source 520 may also be fabricated on the substrate that includes quad Hall effect sensor 400. Current source 520 is designed to produce a high frequency AC current in coil 521 that in turn produces a high frequency magnetic field having a known field strength.

Bias current source 513 produces a bias current 514 that is provided to auxiliary Hall effect sensor 405. Hall effect sensor 405 produces a Hall voltage in response to bias current 514 and the magnetic field produced by calibration coil 521 that is then amplified and demodulated by AFE 515. An output from AFE 515 is then compared to a reference voltage 517 that may be referred to as a "desired response" voltage. Comparator 516 compares the output of AFE 515 and the desired response 517 and produces a feedback signal 518 that may be used to control bias current source 513. In this manner, a closed loop is formed to maintain the output of AFE 515 approximately equal to the desired response voltage 517 over a range of operating temperature, process variation, and package stress by adjusting the magnitude of bias current 514.

Bias current source 512 is also coupled to feedback signal 518 and is designed to adjust the magnitude of the bias current provided to quad Hall effect sensor array 400 proportionally to bias current 514. In this manner, the output of quad Hall effect sensor array is adjusted to compensate for temperature, process variables and package stress in a manner that tracks auxiliary Hall effect sensor 405.

The frequency of calibration current source 520 may be designed to operate above the expected operation range of quad Hall effect sensor 400. In this manner, the effects of the magnetic field produced by excitation coil 521 on quad Hall array sensor 400 may be filtered out by AFE 510.

In another example, the frequency of calibration current source 520 may be designed to operate below the expected operation range of quad Hall effect sensor 400. In this manner, the effects of the magnetic field produced by coil 521 on quad Hall array sensor 400 may be filtered out by a high pass filter included with AFE 510.

Figure 6:
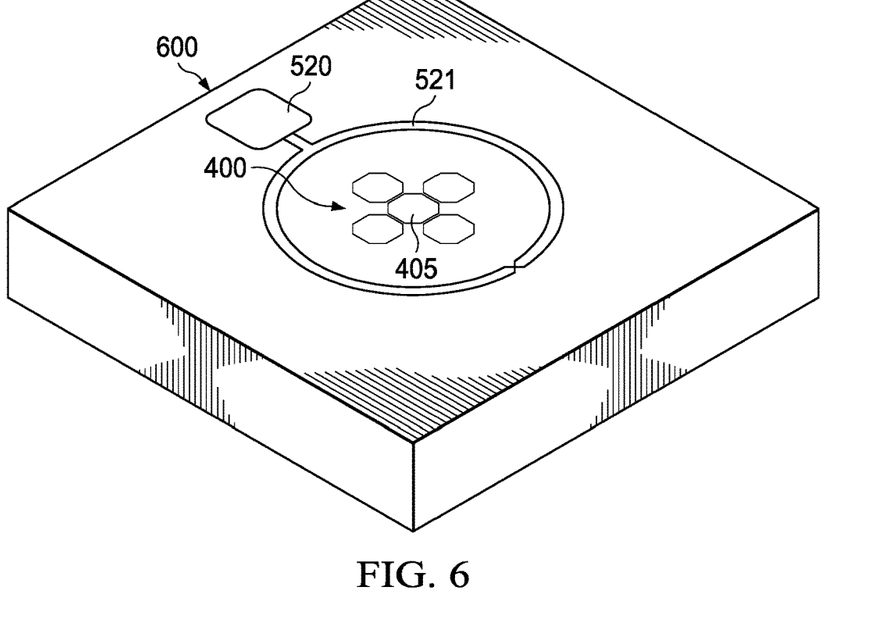
FIG. 6 is an isometric view of a substrate that includes the Hall effect sensors of FIG. 4.

FIG. 6 is an isometric view of a substrate 600 that includes the quad Hall effect sensor 400 of FIG. 4. In this example, substrate 600 may be a silicon die that has been fabricated using known or later developed fabrication techniques to fabricate quad Hall effect sensor 400 and auxiliary Hall effect sensor 405, as described in more detail hereinabove regarding FIG. 5. Coil 521 may be fabricated on one or more metal layers on substrate 600 using known or later developed fabrication techniques. Additional circuitry shown in FIG. 5 may also be fabricated on substrate 600 using known or later developed semiconductor processing techniques.

In this example, excitation coil 521 is illustrated as being a single large coil located a reasonable distance away from the Hall effect sensor elements in order to significantly reduce heating effects. In another example, an excitation coil may be positioned closer to the Hall effect sensors. In another example, a excitation coil may be positioned to overlie the peripheral primary Hall effect sensors.

In this manner, an AC calibration signal 506 can be produced that is out of the frequency band used for the primary Hall effect sensor elements. This eliminates any need to allocate primary Hall effect sensor bandwidth for calibration needs. This may also eliminate capacitive coupling of the calibration signal to the in-band Hall voltage signal produced by the primary Hall effect sensor elements.

A high frequency magnetic field along with complex frequency hopping techniques may be easily used for the calibration process with more available bandwidth provided by the calibration techniques described herein. This may avoid correlation of the calibration signal with the external input magnetic signal, which could create calibration error.

The technique described herein requires only a single large excitation coil 521 at a reasonable distance around the Hall effect sensor elements 400 and thus can significantly reduce heating effects caused by calibration coil 521

Figure 7:
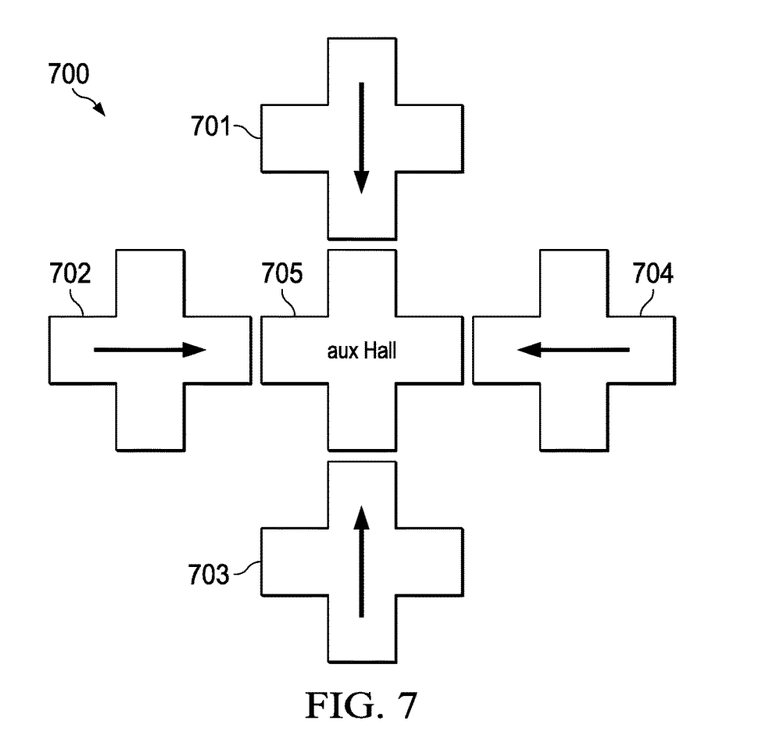
FIGS. 7-10 illustrate other example arrangements of a set of primary Hall effect sensors with an auxiliary Hall effect sensor.

FIG. 7 illustrate another example arrangement of a set of primary Hall effect sensors 700 with an auxiliary calibration Hall effect sensor 705. In this example, the Hall effect sensor elements 701-705 are cross shaped. Also, the arrows illustrate another example of SCT current orientation for one switching phase.

The auxiliary Hall effect sensor 705 and each of the peripheral primary Hall effect sensors are usually of similar form, composition, and function with respect to their own symmetry and with respect to the symmetry of other elements of the Hall effect sensor array 700. The elements are each placed in a symmetrical arrangement such that, for example, the effects of a magnetic field upon each element of the Hall effect sensor array 700 is substantially similar to the respective effects upon each of the other elements of the Hall effect sensor array. The orientation of the switched bias current flow of the primary Hall effect sensors is illustrated for a single switching phase, such as $\varphi=0$.

Figure 8:
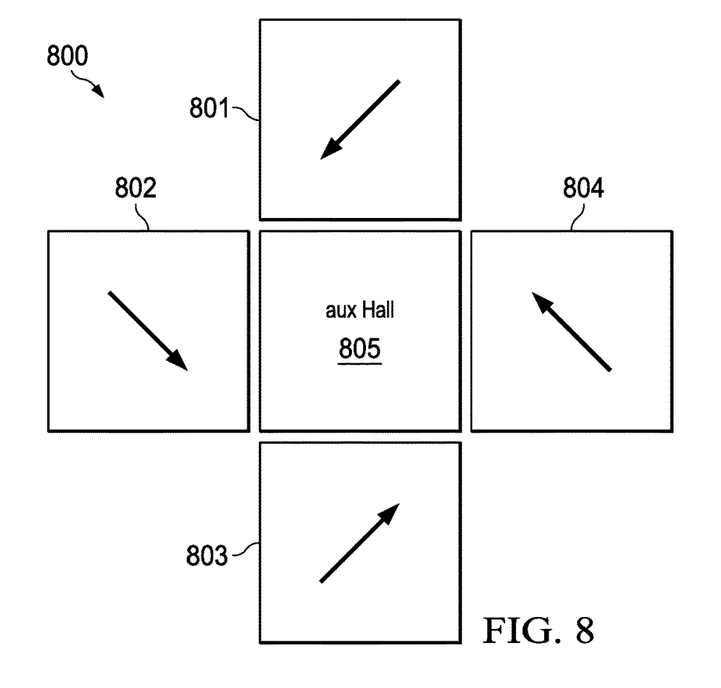

FIG. 8 illustrate another example arrangement of a set of primary Hall effect sensors 800 with an auxiliary calibration Hall effect sensor 805. In this example, the Hall effect sensor elements 801-805 are square shaped. Also, the arrows illustrate another example of SCT current orientation for one switching phase.

The auxiliary Hall effect sensor 805 and each of the peripheral primary Hall effect sensors are usually of similar form, composition, and function with respect to their own symmetry and with respect to the symmetry of other elements of the Hall effect sensor array 800. The elements are each placed in a symmetrical arrangement such that, for example, the effects of a magnetic field upon each element of the Hall effect sensor array 800 is substantially similar to the respective effects upon each of the other elements of the Hall effect sensor array. The orientation of the switched bias current flow of the primary Hall effect sensors is illustrated for a single switching phase, such as $\varphi=0$.

Figure 9:
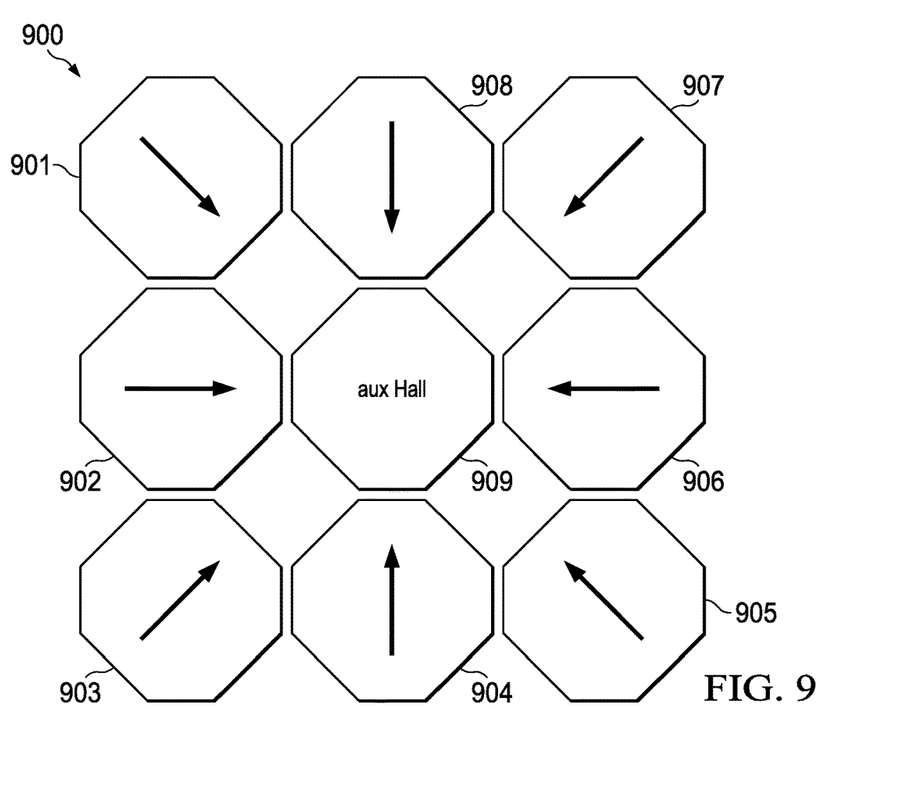

FIG. 9 illustrate another example arrangement of a set of primary Hall effect sensors 900 with an auxiliary calibration Hall effect sensor 909. In this example, the Hall effect sensor elements 901-909 are octagon shaped, but additional elements exist as compared to FIG. 4. Also, the arrows illustrate another example of SCT current orientation for one switching phase.

The auxiliary Hall effect sensor 909 and each of the peripheral primary Hall effect sensors are usually of similar form, composition, and function with respect to their own symmetry and with respect to the symmetry of other elements of the Hall effect sensor array 900. The elements are each placed in a symmetrical arrangement such that, for example, the effects of a magnetic field upon each element of the Hall effect sensor array 900 is substantially similar to the respective effects upon each of the other elements of the Hall effect sensor array. The orientation of the switched bias current flow of the primary Hall effect sensors is illustrated for a single switching phase, such as $\varphi=0$.

Figure 10:
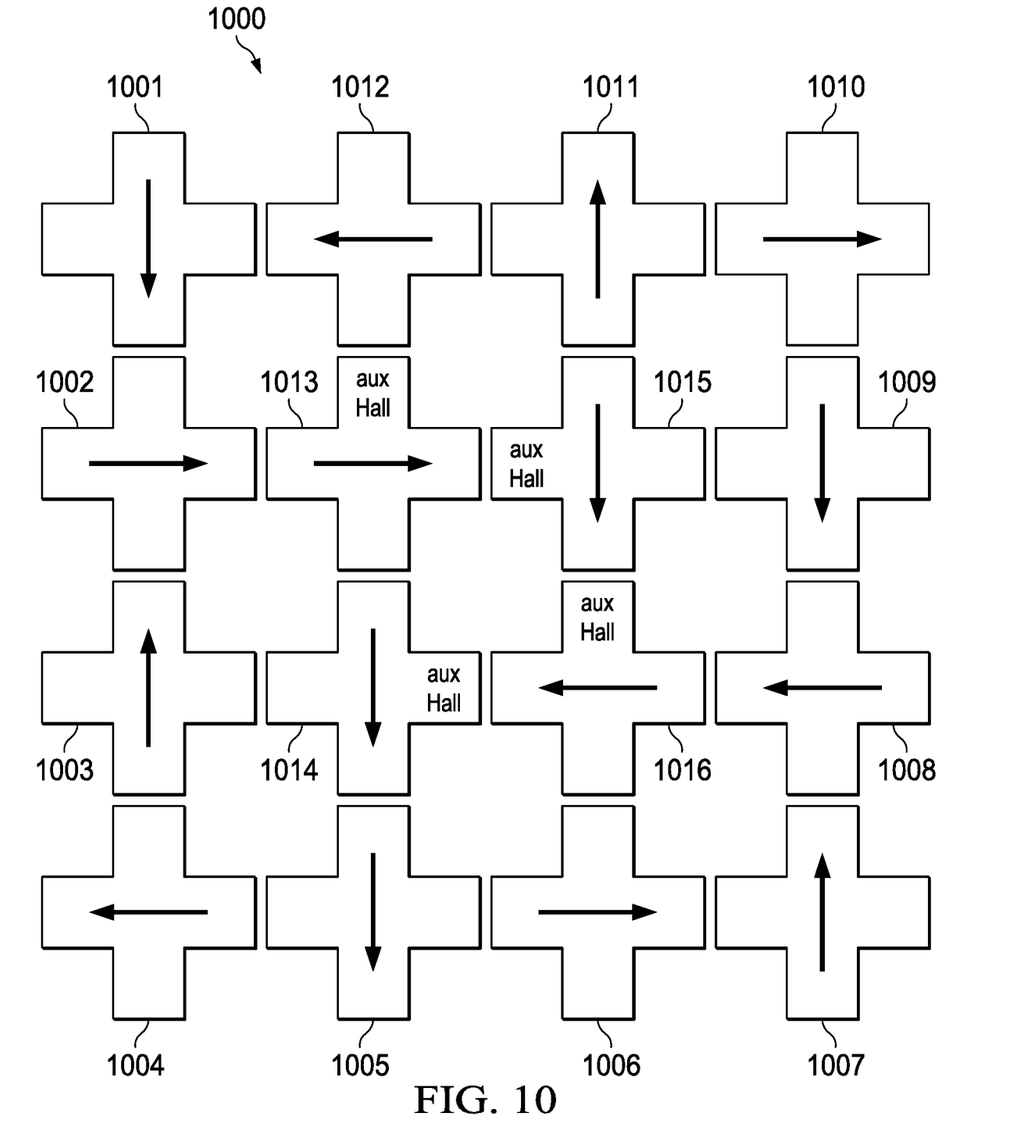

FIG. 10 illustrate another example arrangement of a set of primary Hall effect sensors 1000 with a set of auxiliary calibration Hall effect sensor 1013-1015. In this example, the Hall effect sensor elements 1001-1016 are cross shaped. Also, the arrows illustrate another example of SCT current orientation for one switching phase. In this example, SCT may also be applied to the set of auxiliary Hall effect sensors 1013-1016, as illustrated by the arrows.

The set of auxiliary Hall effect sensor 1013-1016 and each of the peripheral primary Hall effect sensors are usually of similar form, composition, and function with respect to their own symmetry and with respect to the symmetry of other elements of the Hall effect sensor array 1000. The elements are each placed in a symmetrical arrangement such that, for example, the effects of a magnetic field upon each element of the Hall effect sensor array 1000 is substantially similar to the respective effects upon each of the other elements of the Hall effect sensor array. The orientation of the switched bias current flow of the primary Hall effect sensors is illustrated for a single switching phase, such as $\varphi=0$.

Various symmetrical array examples have been illustrated herein, but should not be considered as limiting other configurations. A larger or smaller number of elements may be used, for example. Various SCT implementation and switching sequences may be used. In another example, a non-symmetrical array may be used. In each case, the bias current provided to the auxiliary Hall sensor element(s) is adjusted in response to closed loop signal similar to feedback signal 518 in FIG. 5. Similarly, in each case the bias current provided to each of the primary Hall effect sensor elements is adjusted to track changes in the feedback signal as described for FIG. 5.

Figure 11:
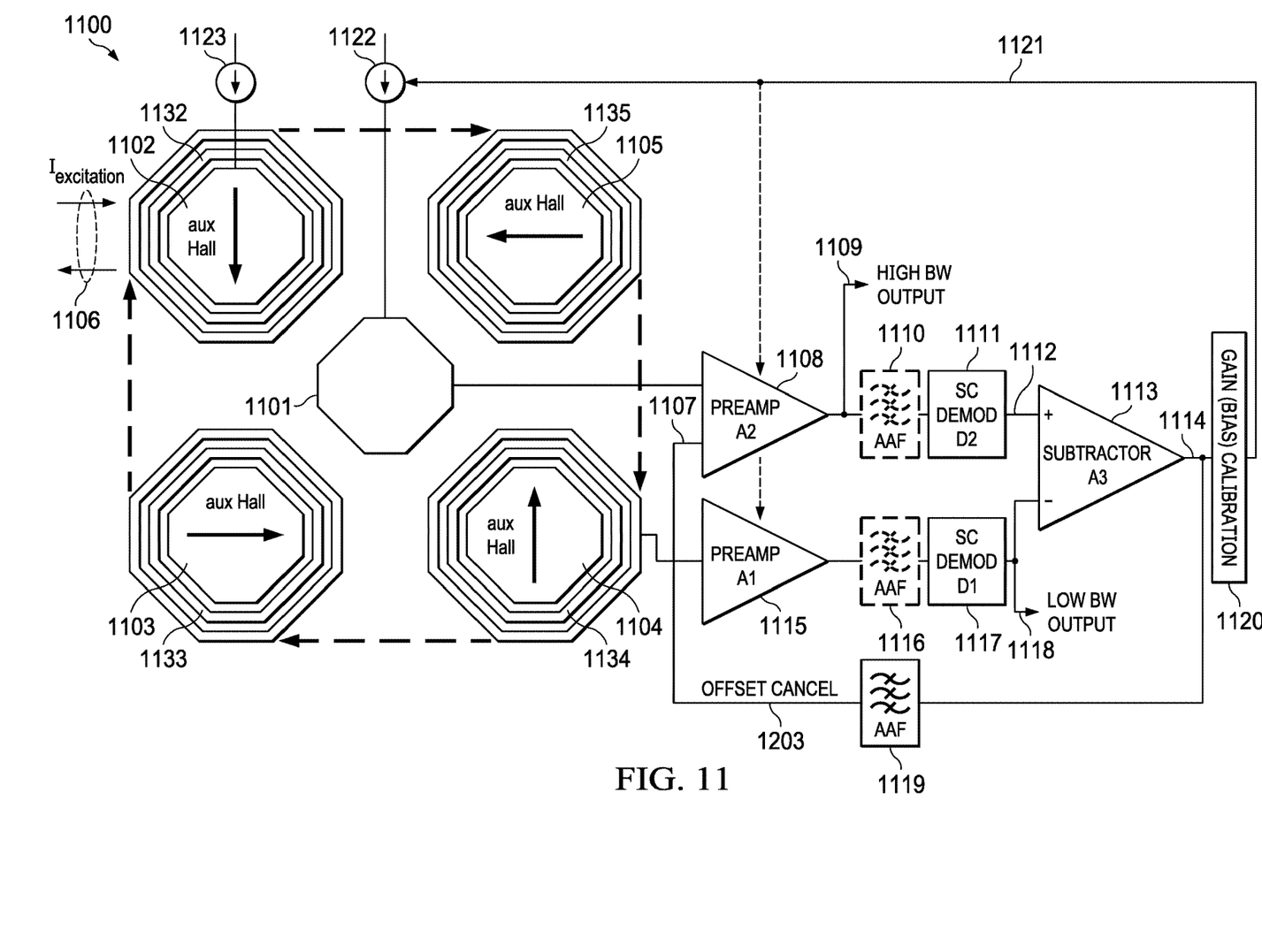
FIG. 11 is a block diagram illustrating another example of calibration circuitry along with offset correction circuitry for an example set of Hall effect sensors.

FIG. 11 is a block diagram illustrating a Hall effect sensor system 1100 that includes another example of calibration circuitry. FIGS. 12A-12D illustrate voltage vs. frequency response curves of various points in the circuitry of FIG. 11.

This example also includes offset correction circuitry. In this example, only a single primary Hall effect sensor 1101 is surrounded by an array of auxiliary Hall effect sensor elements 1102-1105. Also, in this example, five octagonal shaped Hall effect sensor elements are illustrated; however, in other examples, an array of more or fewer elements may be used, and or elements with different shapes may be used, such as illustrated in FIGS. 7-10.

Figure 12A:
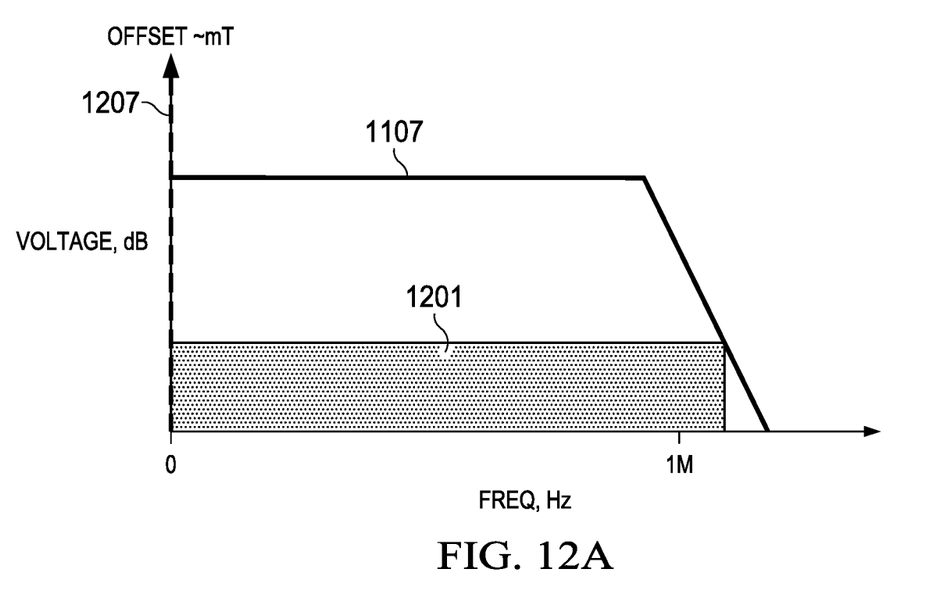
FIGS. 12A-12D illustrate frequency response curves of various points in the circuitry of FIG. 11.

In this example, primary Hall effect sensor 1101 does not use SCT for offset control. This allows a high bandwidth Hall voltage signal 1107 to be produced in response to a high frequency target magnetic field that is impinging sensor system 1100. A bias current is provided by bias current source 1122. The Hall voltage signal is provided to an input of preamplifier 1108. FIG. 12A illustrates the frequency response of Hall voltage signal 1107 produced by Hall effect sensor 1101. High bandwidth Hall voltage signal 1107 may have significant offset, as illustrated by line 1207 in FIG. 12A. For example, an offset equivalent to approximately 1 mT (millitesla) may exist in an example Hall effect sensor. In this example, an acceptable offset should be less than 50 uT, as indicated at 1201 in FIG. 12A An output of preamplifier 1108 is provided to anti-aliasing filter (AAF) 1109. AAF 1109 may be used to restrict the bandwidth of the signal to approximately or completely satisfy the sampling theorem by reducing the power of frequencies above the Nyquist frequency. An output of AAF 1109 is provided to switched capacitor (SC) demodulator 1111. SC demodulator 1111 implements a discrete time demodulation technique of the output of Hall sensor 1101 that uses a spinning current biasing technique. SC demodulator 1111 also provides a low bandwidth output 1112 to an input of subtractor 1113.

In this example, four auxiliary Hall effect sensor elements 1102-1105 are arrayed peripherally around primary Hall effect sensor 1101. They are biased using SCT by auxiliary bias current source 1122 to produce a low bandwidth, low offset Hall voltage. In this example, each auxiliary Hall effect sensor 1102-1105 is surrounded by a separate coil 1132-1135 that are each driven by an excitation signal 1106 to produce a calibrated magnetic field that impinges on each corresponding auxiliary Hall effect sensor to produce a low bandwidth calibration signal that is provided to an input of preamplifier 1115.

The coils may be fabricated on one or more conductive layers, such a metallic layers, that may be formed over the Hall effect sensors in a similar manner as described with regard to FIG. 6. The coils may be positioned to be peripheral to each auxiliary Hall effect element in some examples. In other examples, the coils may be positioned to partially or completely overlie each respective auxiliary Hall effect sensor element. The magnitude of the calibration magnetic field is determined by the number of coils and the excitation current that is provided to the coils. In this example, each coil may have 24 turns; however, in other examples, a different number of turns may be used. More turns produce a stronger magnetic field, but may require a larger voltage excitation signal.

Figure 12B:
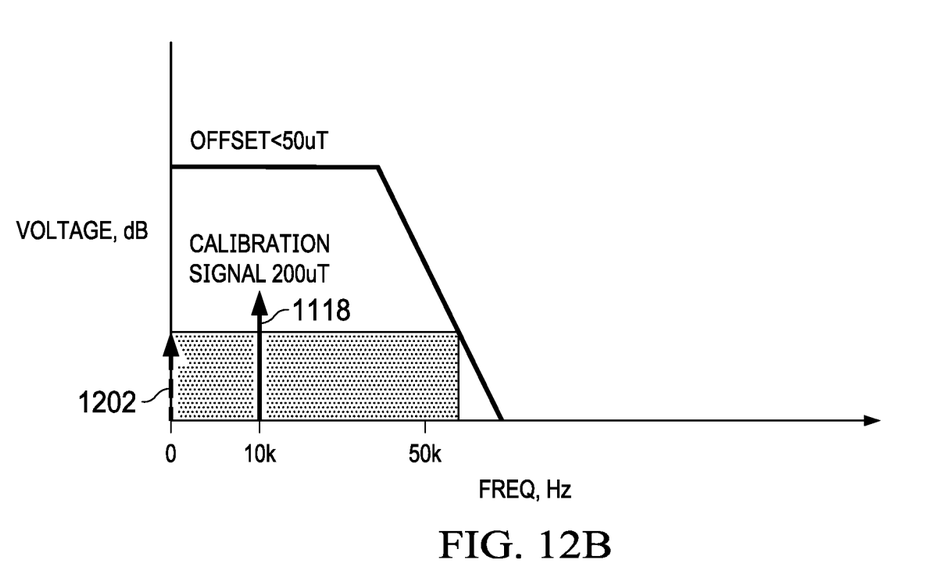

The coils may be excited by a fixed frequency excitation current 1106. In this example, the excitation frequency is 10 kHz as illustrated in FIG. 12B; however, in other examples, a higher or lower frequency may be used. In some examples, a frequency hopping technique may be used to reduce any correlation between the excitation field and the target field.

An output of preamplifier 1115 is provided to anti-aliasing filter (AAF) 1116. AAF 1116 may be used to restrict the bandwidth of the signal to approximately or completely satisfy the sampling theorem by reducing the power of frequencies above the Nyquist frequency. An output of AAF 1116 is provided to switched capacitor (SC) demodulator 1117. In this example, the calibration bias source 1123 operates at a frequency of approximately 10 kHz, and the excitation coils are designed to produce a magnetic field having a flux strength of approximately 200 µT. The resulting signal is indicated at 1118 in FIG. 12B. This low bandwidth signal has a low offset due to the SCT applied to the four auxiliary Hall effect sensor elements 1102-1105, as indicated at 1202 in FIG. 12B.

Figure 12C:
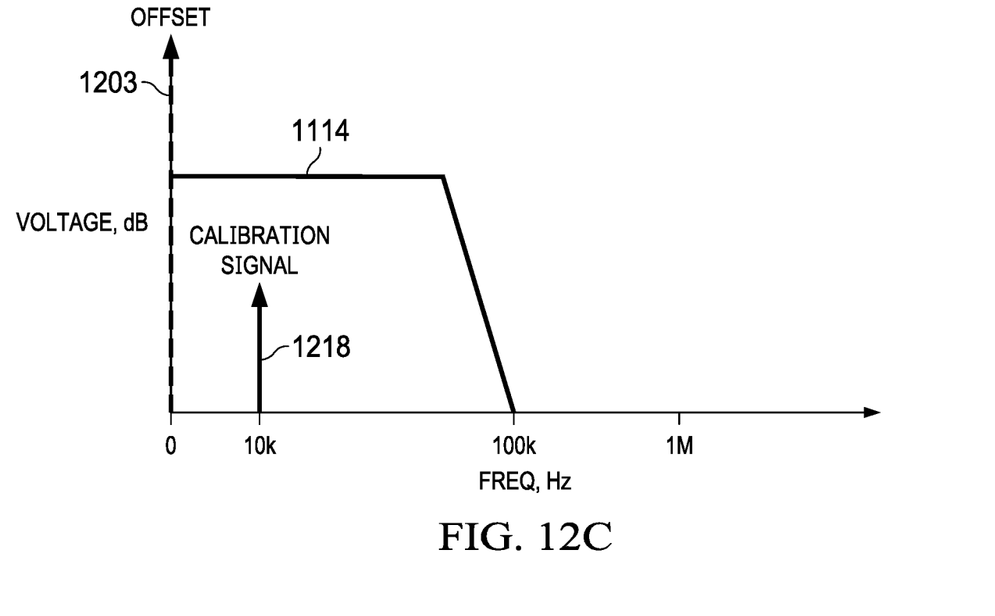

Subtractor 1113 subtracts low offset signal 1118 from high offset signal 1112 to produce a signal 1114 that includes a 10 kHz calibration signal 1218 shown in FIG. 12C and an offset cancellation signal 1203 shown in FIG. 12C.

SC demodulation D1 (1117) is necessary to demodulate the output of Hall quad 1102-1105. Along with demodulation it may also produce some undesirable aliasing of the high frequency magnetic signal. SC demodulator 1111 in the high bandwidth path (Hall 1101) also uses the same SC demodulator configuration so that the aliasing effects are identical and as a result a perfect cancellation may be produced by subtractor 1113.

Gain calibration module 1120 receives signal 1114 and produces a bias control signal 1121 that is fed back to control bias current source 1123 in in a manner that maintains the amplitude of calibration signal 1118 at an approximately fixed value over a range of temperature, package stress and process parameters. Bias current source 1122 is configured to track bias current source 1123 and thereby maintain the sensitivity of primary Hall effect sensor element 1101 over the same range of temperature, package stress and process parameters. A desired response method is applied to the Hall quad 1102-1105, which is excited with calibration signal 1106. Therefore, gain calibration is applicable to Hall quad 1102-1105. Due to proximity and symmetric placement, it may be assumed that gain/sensitivity of Hall effect sensor element 1101 is same as Hall quad 1102-1105.

Figure 12D:
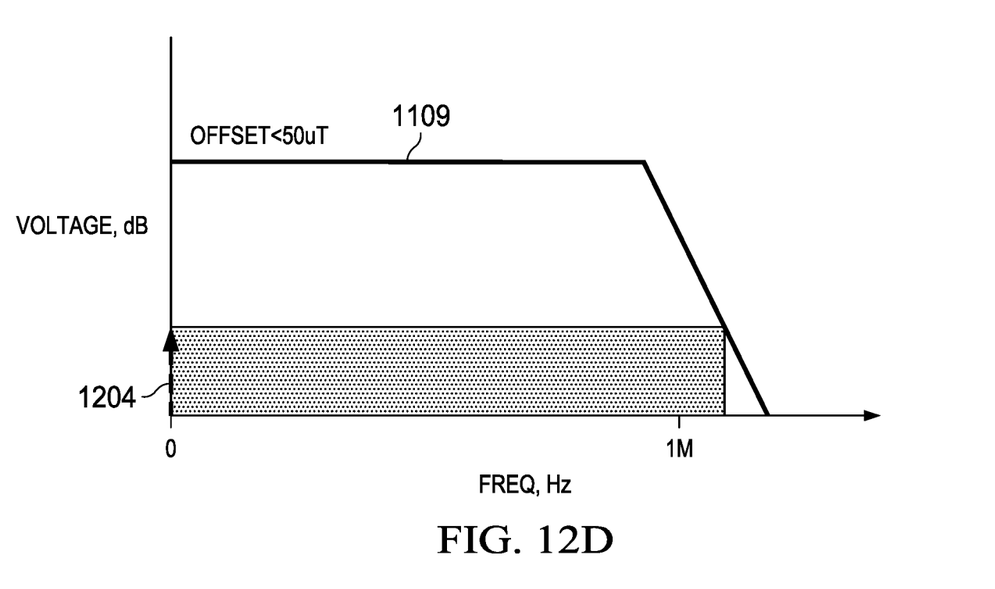

AAF 1119 receives signal 1114 and filters out the calibration signal component and provides the offset cancellation component 1203 shown in FIG. 12C to an input of preamp 1108. Preamp 1108 subtracts offset cancellation component 1203 from Hall voltage signal 1107 to form a high bandwidth, low offset output signal 1109. FIG. 12D illustrates the frequency response of output signal 1109 with an offset of less than 50µ shown at 1204 in FIG. 12D. In this example, preamp 1108 include subtraction logic; however, in another example, offset cancellation signal 1203 and an output from Hall effect sensor 1101 may be combined in a separate subtraction circuit.

In another example, AAF 1110 and/or AAF 1116 may be omitted by configuring a bandwidth limitation in preamplifiers 1108/1115. Alternatively, an aliasing effect may be cancelled by using the two SC demodulators 1111, 1117 and subtractor 1113 as described hereinabove.

Figure 13:
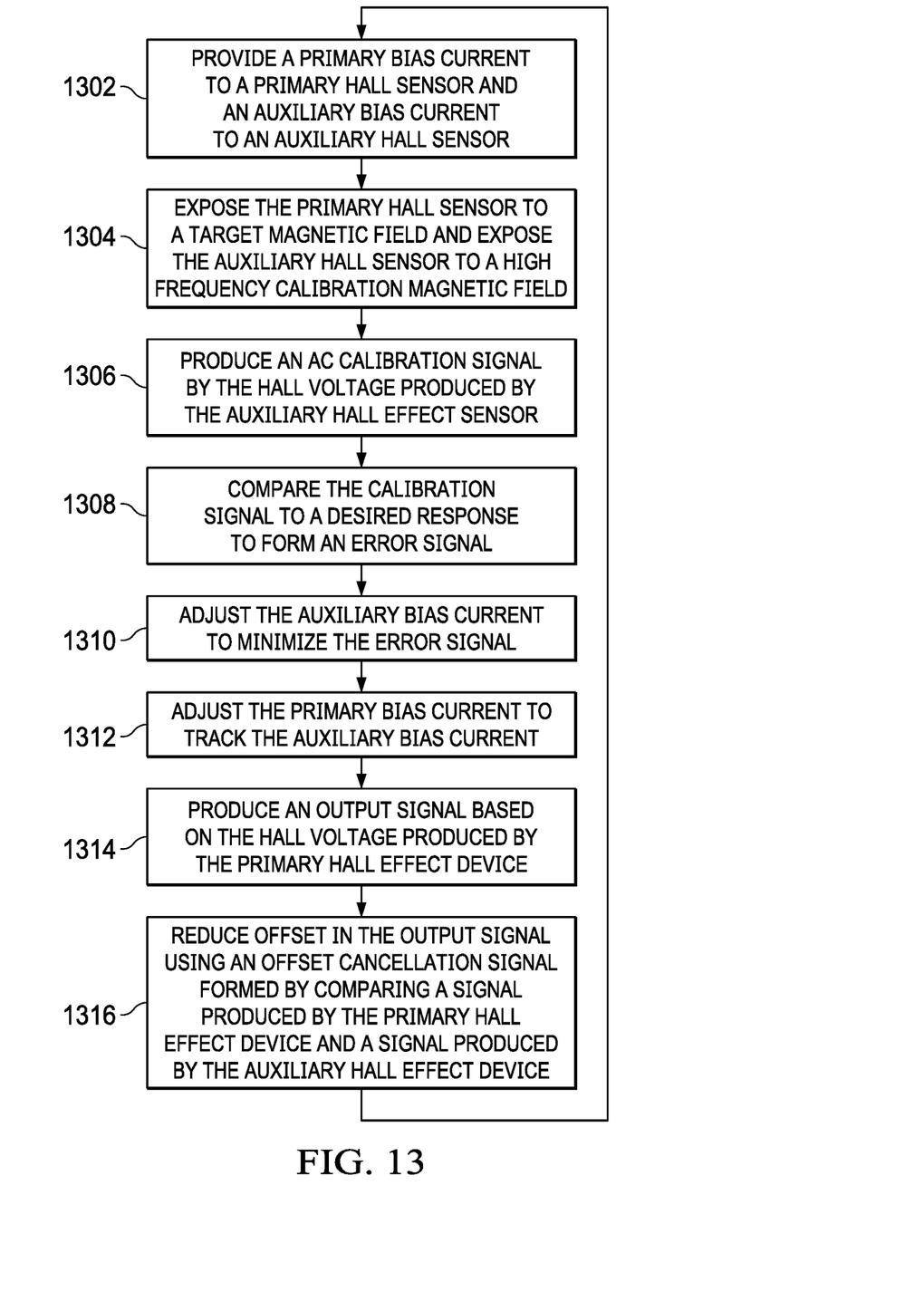
FIG. 13 is a flow chart illustrating operation of a set of primary Hall effect sensors with an auxiliary calibration Hall effect sensor.

FIG. 13 is a flow chart illustrating operation of a set of primary Hall effect sensors with an auxiliary calibration Hall effect sensor, such as Hall effect sensor device 500 in FIG. 5 or Hall effect sensor device 1100 in FIG. 11.

At 1302, a primary bias current is provided to a primary Hall effect sensor and an auxiliary bias current is provided to an auxiliary Hall effect sensor. The primary Hall effect may be: multiple elements, such as elements 401-404 in FIG. 5; or a single element, such as element 1101 in FIG. 11. The auxiliary Hall effect sensor may be: a single element, such as element 405 in FIG. 5; or multiple elements, such as elements 1102-1105 in FIG. 11.

Figure 14:
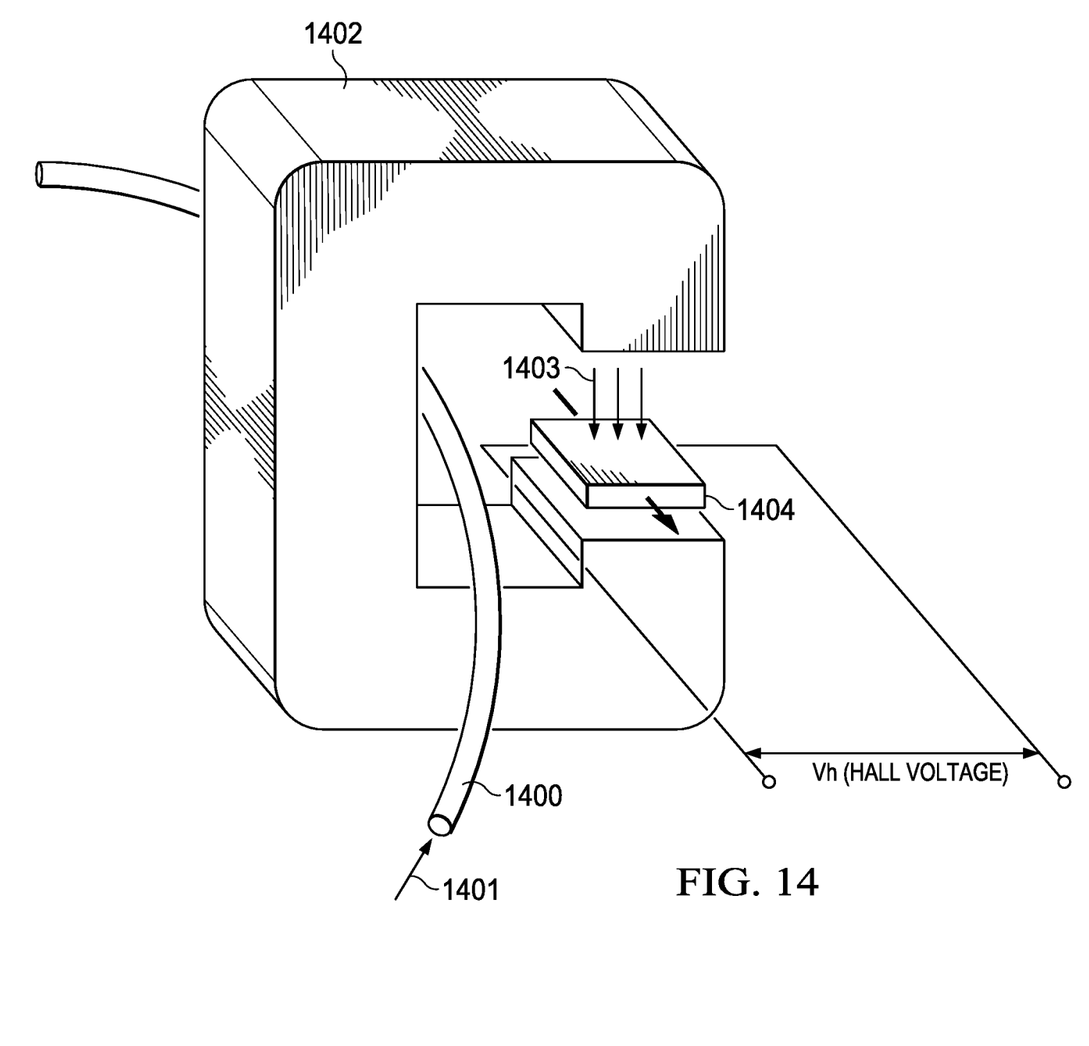
FIG. 14 illustrates an example system using a Hall effect sensor.

At 1304, the primary Hall effect sensor is exposed to a target magnetic field, such as flux lines 232 in FIG. 2 or target flux lines 1403 in FIG. 14. The primary and auxiliary Hall effect sensors are located adjacent to each other, as illustrated in FIGS. 4-11 and therefore the auxiliary Hall effect sensor will also be exposed to the target magnetic field. The auxiliary Hall effect sensor is also exposed to a high frequency calibration magnetic field produced by an excitation coil located adjacent the auxiliary Hall effect sensor, such as coil 521 in FIG. 500 or coil(s) 1332-1335 in FIG. 11. The primary Hall effect sensor may also be exposed to the calibration magnetic field due to the proximity of the Hall effect sensors.

At 1306, a high frequency AC calibration signal is produced by the Hall voltage produced by the auxiliary Hall effect sensor.

At 1308, the AC calibration signal is compared to a desired or "expected" result based on the excitation coil(s) and the amount of excitation current provided to the excitation coil(s) to form an error signal.

At 1310, the auxiliary bias current is adjusted to minimize the error signal. This has the effect of controlling the sensitivity of the auxiliary Hall effect sensor to produce stable Hall voltage over a range of temperatures, package stress, and process variation.

At 1314, the primary bias current is adjusted to track the auxiliary bias current. This has the effect of controlling the sensitivity of the primary Hall effect sensor to produce stable Hall voltage over the same range of temperatures, package stress, and process variation.

At 1316, some examples, such as device 1100 in FIG. 11, may reduce offset in the output signal using an offset cancellation signal formed by comparing a signal produced by the primary Hall effect device and a signal produced by the auxiliary Hall effect device. The AC calibration signal can be filtered out of this offset cancellation signal as illustrated at 1119 in FIG. 11.

This process may be performed in a continuous, or near continuous manner. For example, at 1304, the calibration magnetic field may be excited for a period of time and then turned off for a period of time, and repeated in a periodic manner.

In some examples, the frequency of the calibration magnetic field may be higher than the operating bandwidth of the primary Hall effect sensor. In other examples such as device 1100 in FIG. 1100, the bandwidth of the primary Hall effect sensor may be much greater and the calibration signal may have a frequency within the bandwidth of the primary Hall effect sensor. In some examples, the frequency of the calibration magnetic field may hop to different frequencies over time to minimize correlation with the target magnetic field.

In this manner, a Hall effect sensor device is provided that can operate in a stable manner over a range of temperature, package stress, process variables, etc.

System Example

FIG. 14 illustrates an example system that may include a Hall effect sensor 1404 as described herein. In this example, Hall effect sensor 1404 may be similar to the sensor described in FIG. 5 or FIG. 11. Hall effect sensor 1404 may be encapsulated to form a standalone package, for example. This example illustrates a system that includes a wire 1400 carrying a current 1401. A magnetic field surrounds a current carrying field. A flux core 1402 may be placed around the wire to direct target magnet flux 1403 through a region in which Hall effect sensor 1404 is located. An accurate determination of the current 1401 flowing through wire 1400 may be made, because the sensitivity of Hall effect sensor 1404 is stable over a range of temperatures and other parameters, as described hereinabove for devices 500 in FIGS. 5 and 1100 in FIG. 11.

Wire 1401 and Hall effect sensor 1404 may be part of a direct current (DC) to DC converter, for example. A DC to DC converter may be designed to convert high voltages from one level to another. Accurate measurement of current flowing in the converter is needed to operate efficiently.

Other Embodiments

In the described examples, a cross shaped device is illustrated herein. In other embodiments, other element shapes may be patterned, such as an octagon or substantially octagonal, a triangle or substantially triangular, a quatrefoil or substantially quatrefoil shaped, a circle or substantially circular shape, etc. Similarly, depending on the geometry, the number of contact pads and corresponding wires may be altered to fit a given application.

Examples described herein include four or more Hall effect elements arranged in a symmetrical manner around a central Hall effect element. However, in some other examples, a smaller number of Hall effect elements may be used, such as a single primary Hall effect sensor paired with a single auxiliary Hall effect sensor.

In this description, the term "couple" and derivatives thereof mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Modifications are possible in the described embodiments, and other embodiments are possible, within the scope of the claims.

What is claimed is:

1. A method of operating a Hall effect sensor device, the method comprising:
    producing a calibration alternating magnetic field by an excitation coil;
    providing a first bias current to a first Hall effect sensor element, and providing a second bias current to a second Hall effect sensor element, in which the first Hall effect sensor element is adjacent the second Hall effect sensor element;
    exposing the first Hall effect sensor element to a target magnetic field, producing a first Hall voltage by the first Hall effect sensor element responsive to the first bias current and the target magnetic field, and producing a sensor signal responsive to the first Hall voltage;
    exposing the second Hall effect sensor element to the calibration alternating magnetic field, and producing a second Hall voltage by the second Hall effect sensor element responsive to the second bias current and the calibration alternating magnetic field;
    producing an alternating current (AC) calibration signal responsive to the second Hall voltage;
    producing an error signal responsive to a difference between the AC calibration signal and a targeted response signal;
    adjusting the second bias current to minimize the error signal; and
    adjusting the first bias current to track the adjusted second bias current.

2. The method of claim 1, further comprising buffering the sensor signal to form a sensor output signal.

3. The method of claim 1, further comprising:
    filtering the sensor signal to form a filtered sensor signal;
    filtering the AC calibration signal to form a filtered calibration signal;
    producing an offset cancellation signal by subtracting the filtered calibration signal from the filtered sensor signal; and
    combining the sensor signal and the offset cancellation signal to form a sensor output signal.

4. The method of claim 1, wherein the calibration alternating magnetic field is produced by the excitation coil periodically over time.

5. The method of claim 1, further comprising reducing offset in the first Hall voltage by switching the first bias current to provide a spinning current bias to the first Hall effect sensor element.

6. The method of claim 1, wherein the first Hall effect sensor element includes multiple Hall effect elements positioned peripherally around the second Hall effect sensor element.

7. The method of claim 3, further comprising reducing offset in the second Hall voltage by switching the second bias current to provide a spinning current bias to the second Hall effect sensor element.

8. The method of claim 7, wherein the spinning current bias is not provided to the first Hall effect sensor element.

9. The method of claim 3, wherein the second Hall effect sensor element includes multiple Hall effect elements positioned peripherally around the first Hall effect sensor element.

10. A method of operating a Hall effect sensor device, the method comprising:

producing a calibration magnetic field by an excitation coil;

providing a first bias current to a first Hall effect sensor element, and providing a second bias current to a second Hall effect sensor element, in which the first Hall effect sensor element is adjacent the second Hall effect sensor element;

exposing the first Hall effect sensor element and the second Hall effect sensor element to a target magnetic field, and producing a first Hall voltage by the first Hall effect sensor element responsive to the first bias current and the target magnetic field;

exposing the second Hall effect sensor element to the calibration magnetic field, and producing a second Hall voltage by the second Hall effect sensor element responsive to the second bias current, the target magnetic field and the calibration magnetic field;

producing an offset cancellation signal responsive to a difference between the second Hall voltage and the first Hall voltage;

subtracting the offset cancellation signal from the first Hall voltage to produce an output signal;

adjusting the second bias current to maintain the second Hall voltage within a fixed range; and adjusting the first bias current to track the adjusted second bias current.

11. The method of claim 10, further comprising reducing offset in the second Hall voltage by switching the second bias current to provide a spinning current bias to the second Hall effect sensor element.

12. The method of claim 10, wherein the calibration magnetic field is periodically over time.

13. The method of claim 10, wherein the second Hall effect sensor element includes multiple Hall effect elements positioned peripherally around the first Hall effect sensor element.

\* \* \* \* \*